(12) United States Patent
Bhattacharyya (10) Patent No.: US 7,276,760 B2
(45) Date of Patent: Oct. 2, 2007

(54) LOW POWER MEMORY SUBSYSTEM WITH PROGRESSIVE NON-VOLATILITY

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/066,905

(22) Filed: Feb. 25, 2005

(65) Prior Publication Data
US 2006/0192240 A1    Aug. 31, 2006

(51) Int. Cl.
*H01L 27/148*    (2006.01)
*H01L 29/768*    (2006.01)

(52) U.S. Cl. ............... 257/321; 257/314; 257/315; 257/320

(58) Field of Classification Search ............... 257/321, 257/314, 315, 320; 365/185.03
See application file for complete search history.

(56) References Cited

U.S. PATENT DOCUMENTS 6,040,216 A * 3/2000 Sung .................... 438/257
6,784,480 B2 * 8/2004 Bhattacharyya ........... 257/314
2002/0163834 A1 * 11/2002 Scheuerlein et al. ..... 365/185.17
2005/0199944 A1 * 9/2005 Chen et al. ................ 257/324

FOREIGN PATENT DOCUMENTS

JP    6-5822   * 1/1994
JP    8-8350   * 1/1996

OTHER PUBLICATIONS

Dana Lee et al.; Vertical floating-gate $4.5F^2$ Split-gate NOR Flash Memory at 110nm Node; Silicon Storage Technology, Inc. and PowerChip Semiconductor Corporation; 2004 Symposium on VLSI Technology Digest of Technical Papers; pp. 72-73.

* cited by examiner

*Primary Examiner*—Shouxiang Hu
(74) *Attorney, Agent, or Firm*—Leffert Jay & Polglaze, P.A.

(57) ABSTRACT

The memory system is comprised of a plurality of memory arrays that are coupled to a processor. The memory arrays are comprised of non-volatile memory cells that have read/write speeds and charge retention times that are different from the other memory arrays of the system. Each of the memory cells of each array has a tunnel layer under an embedded trap layer. Each array has memory cells with a different tunnel layer thickness to change the read/write speeds and charge retention times for that array.

24 Claims, 6 Drawing Sheets

LOW POWER MEMORY SUBSYSTEM WITH PROGRESSIVE NON-VOLATILITY

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including read only memory (ROM), static random-access memory (SRAM), dynamic random access memory (DRAM), and flash memory.

Conventional DRAM cells are comprised of a switching transistor and an integrated storage capacitor tied to the storage node of the transistor. Charge storage is enhanced by providing appropriate storage capacity in the form of a stacked capacitor or a trench capacitor in parallel with the depletion capacitance of the floating storage node. DRAM cells are volatile and therefore lose data when the power is removed.

DRAMs use one or more arrays of memory cells arranged in rows and columns. Each of the rows of memory cells is activated by a corresponding row line that is selected from a row address. A pair of complementary digit lines are provided for each column of the array and a sense amplifier coupled to the digit lines for each column is enabled responsive to a respective column address. The sense amplifier senses a small voltage differential between the digit lines and amplifies such voltage differential.

Due to finite charge leakage across the depletion layer, the capacitor has to be recharged frequently to ensure data integrity. This is referred to in the art as refreshing and can be accomplished by periodically coupling the memory cells in the row to one of the digit lines after enabling the sense amplifiers. The sense amplifiers then restore the voltage level on the memory cell capacitor to a voltage level corresponding to the stored data bit. The permissible time between refresh cycles without losing data depends on various factors such as rate of charge dissipation in the memory capacitor.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

For code applications, a faster performing, less dense NOR cell is typically employed. For data storage applications, a slower performing, denser NAND cell configuration is typically employed.

SRAM, DRAM, and flash memories typically require relatively large amounts of power. This is due to the volatile memories high current requirement during programming and addressing and/or the requirement for frequent refreshing. Flash memory typically operates by channel hot electron injection that is very power inefficient. Therefore, memory systems that are built on the hierarchy of SRAM/DRAM/flash have a high power requirement and are thus not optimal for portable electronic devices. An additional problem is that flash memory has a limited endurance due to the high programming voltages.

Silicon-oxide-nitride-oxide-silicon (SONOS) type memories have lower power requirements but require higher fields (typically $8 \times 10^6$-$10 \times 10^6$ V/cm) and are slow to write and erase. Direct Tunnel Memories (DTM) based on ultra-thin tunnel oxide exhibit infinite endurance but memory retention is on the order of 1-10 seconds.

For the reasons stated above, and for other reasons stated below which will become apparent to those skilled in the art upon reading and understanding the present specification, there is a need in the art for a lower power, higher performance and higher endurance non-volatile memory device and memory subsystem that can bridge the application gap between SRAM/DRAM and non-volatile memory devices, especially for portable and stand-alone electronic applications.

SUMMARY

The above-mentioned problems with non-volatile memory, performance, and other problems are addressed by the present invention and will be understood by reading and studying the following specification.

The embodiments of the present invention encompass a memory system that includes embedded trap or embedded nanocrystal direct tunnel memory (DTM) non-volatile cells with progressive non-volatility. The memory system comprises a control circuit for generating memory system signals that is coupled to a plurality of memory arrays. Each memory array is comprised of a plurality of memory cells with a gate stack having a tunnel layer. At least two of the plurality of memory arrays comprises memory cells that have tunnel layers with different thicknesses.

The memory cells, in one embodiment, are enhanced, non-volatile DTM cells that are formed on a substrate with doped drain and source regions. An oxynitride layer is formed over the substrate between each drain/source region pair. An embedded trap layer or an embedded nanocrystal layer is formed over the oxynitride layer. An injector layer may be optionally formed over the embedded trap layer or the embedded nanocrystal layer. A high dielectric constant layer is formed over the injector layer to prevent leakage of the trapped charge layer. A polysilicon control gate is formed over the high dielectric constant layer and may include a conducting passivation underlayer.

The cells can be formed in a planar architecture or a two element, split channel, three-dimensional device. The planar cell is formed with the high dielectric constant layer being formed over and substantially around three sides of the embedded trap layer or embedded nanocrystal layer. The polysilicon control gate is also formed substantially around three sides of the high dielectric constant layer and may contain a passivation underlayer.

The split channel, three-dimensional device is formed in a trench where the bi-stable elements are formed on each sidewall in series with a fixed threshold element. A shared control gate is formed in the trench such that it is shared by all of the elements in the trench. The control gate and an oxide layer that separates the control gate from the sidewalls forms the fixed threshold devices. A source line region is formed in the substrate at the bottom of the trench and bit line regions are formed on either side of the trench.

Further embodiments of the invention include methods and apparatus of varying scope.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 1:
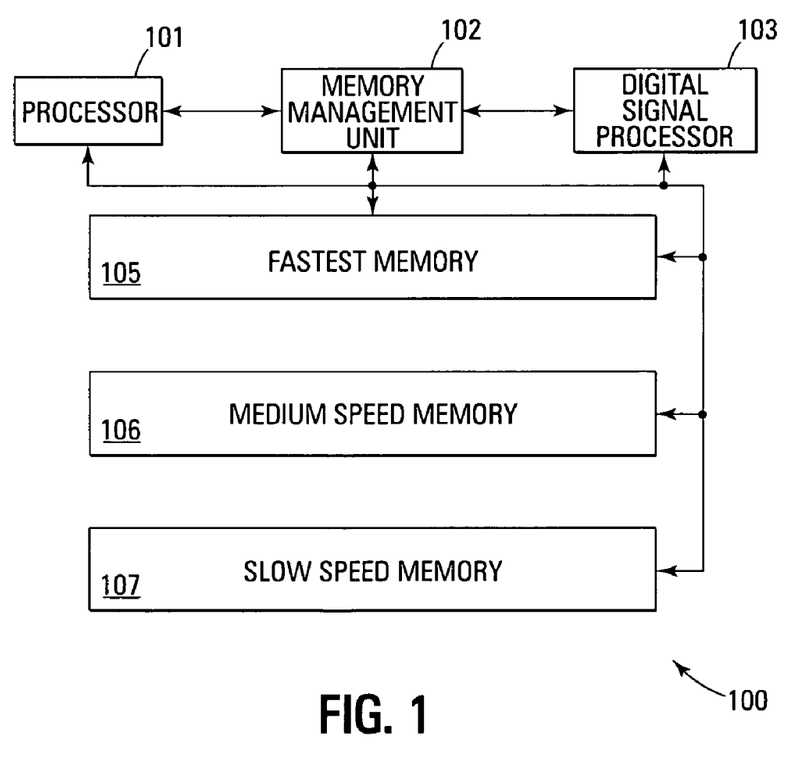
FIG. 1 shows a block diagram of one embodiment of a memory system of the present invention.

FIG. 1 illustrates a block diagram of one embodiment of an electronic system 100 of the present invention. The system 100 uses modified direct tunnel memory (DTM) cells, illustrated subsequently with reference to FIGS. 2, 3, and 4, that have an embedded trap or an embedded nanocrystal region for storing a charge. The modified DTM cell significantly improves memory retention by several orders of magnitude over the prior art, providing a partial non-volatile memory with less frequent refresh cycles while maintaining high program/erase speeds and the infinite endurance of DTM. The DRAM of a system can be replaced by the fast version of the modified DTM cell. Both power and performance benefits are derived by replacing the floating gate of a typical non-volatile memory cell with a relatively thin layer of embedded-trap oxynitride or embedded metal nano-dot insulator to contain charges while charges get transported at high speed and at low voltages through the direct tunnel layer.

Key attributes of the modified DTM cells have been referenced and will be discussed subsequently in FIGS. 2, 3, and 4. Multiple speed and range of non-volatility of the modified DTM cells are employed for the memory array blocks 105-107 while the fastest memory block 105 functionally replaces DRAM arrays as stated earlier. Standard DTM cells are denser than DRAM cells since they are capacitor-less, single transistor memory devices. Modified DTM cells have additional advantages in density since they more efficiently couple to the control gate. While all memory blocks use modified DTM cells, the fastest block may use less dense DTM cells and a NOR array architecture to achieve the speed objective. Other memory blocks may use an appropriate architecture to achieve speed-density trade-offs. The desired range of non-volatility is achieved by appropriately adjusting the tunnel insulator thickness of the DTM cells.

The memory devices of the present invention can be implemented in both planar and three-dimensional architectures as discussed with reference to the subsequent figures. The three-dimensional embodiment has the added benefits of providing a contact-less, virtual ground array for high bit density configurations.

The electronic system 100 comprises a processor 101 for controlling operation of the system 100. This circuit 101 may be a microprocessor, a microcontroller, or some other type of controlling circuit.

A memory management unit (MMU) 102 is coupled to the processor 101 and the memory blocks 105-107. The MMU 102 is the component that manages virtual memory systems. The MMU 102 may be part of the processor 1101 or a separate block. The MMU 102 typically includes a small amount of memory that holds a table for matching virtual addresses to physical addresses.

In operation, all requests for memory access (i.e., read, write) are sent to the MMU 102. The MMU 102 then determines whether the data is in one of the memory blocks 105-107 or needs to be fetched from another memory location (i.e., mass storage). If the data is not in memory, the MMU 102 may issue an error message.

A digital signal processor (DSP) 103 may be included in the system for processing received signals. The DSP 103 is a specialized processor that is adapted specifically for processing signals. The DSP 103 typically has a special instruction set optimized for this task.

The memory system of FIG. 1 is for purposes of illustration only. Not all of the blocks are required for proper operation and the quantity of memory blocks 105-107 shown may be different for other embodiments. For example, one embodiment may only have a processor 101 and three memory blocks 105-107. Another alternate embodiment may have a processor with a different quantity of memory blocks 105-107.

The memory blocks 105-107 may be comprised of entire memory devices as illustrated subsequently in FIG. 6 or simply memory arrays that are controlled by one central memory controller and peripheral circuitry. In the embodiment of FIG. 1, the memory blocks 105-107 are broken down into three different speeds and retention characteristics.

One block 105 is the fastest memory block in terms of access speed (i.e., programming and erase operations). Such a block could be used to replace any required DRAM devices in the system since the read and write times could be in the range of DRAM speed (i.e., 30-50 ns). However, data retention can be improved by several orders of magnitude when compared with DRAM. Power consumption can also be improved by many orders of magnitude when compared to DRAM.

In order to achieve these memory attributes, the first memory block 105 is comprised of an array of memory cells that have a tunnel thickness on the order of 1.5 nm. This would give the cells a retention time that could be measured in hours.

The second memory block 106 is comprised of medium speed memory cells. This block is comprised of an array of memory cells that have a tunnel thickness on the order of 2.5 nm. This would give the cells a retention time that could be measured in days or weeks. The thicker tunnel layer would also translate into slightly slower read/write times for the cells.

The third memory block 107 is comprised of the slowest speed memory cells. This block is comprised of an array of memory cells that have a tunnel thickness on the order of 3.5 nm. This would give the cells a retention time that could be on the order of 10 years or more. The thicker tunnel layer would also require the longest read/write times of the three memory blocks 105-107.

The above-illustrated tunnel layer thicknesses are for purposes of illustration only. Each block of memory may have different tunnel layer thicknesses than those illustrated in order to adjust the trade-off between read/write times and desired retention times.

In one embodiment, the system 100 illustrated in FIG. 1 is comprised of separate integrated circuits for each functional block 101-103, 105-107. An alternate embodiment integrates each of the functional blocks into a single chip. Similarly, the multiple memory blocks 105-107 may be implemented on a single chip separate from the processor 101, MMU 102, and DSP 103 blocks.

The embodiments of the present invention do not require that the memory blocks 105-107 have the same density or architecture (i.e., NAND, AND, NOR, VGA). For example, in one embodiment, the slowest memory array 107 may be a NAND array in a one gigabyte density, the medium speed memory array 106 may be a NOR array in a 512 megabyte density, and the fastest memory array 105 may be a NOR array in a 16 to 32 megabyte density.

The embodiments of the present invention can also use different types of memory cells in each memory block 105-107. In one embodiment, all three memory blocks 105-107 are comprised of either planar memory cells, as illustrated in FIG. 2 or 3, or split channel, three dimensional memory cells, as illustrated in FIG. 4. In another embodiment, one of the memory blocks is comprised of split channel, three dimensional memory cells while the remaining memory blocks are planar. Still other embodiments use other variations on which memory blocks use planar and which use the higher density, vertical cells.

Figure 2:
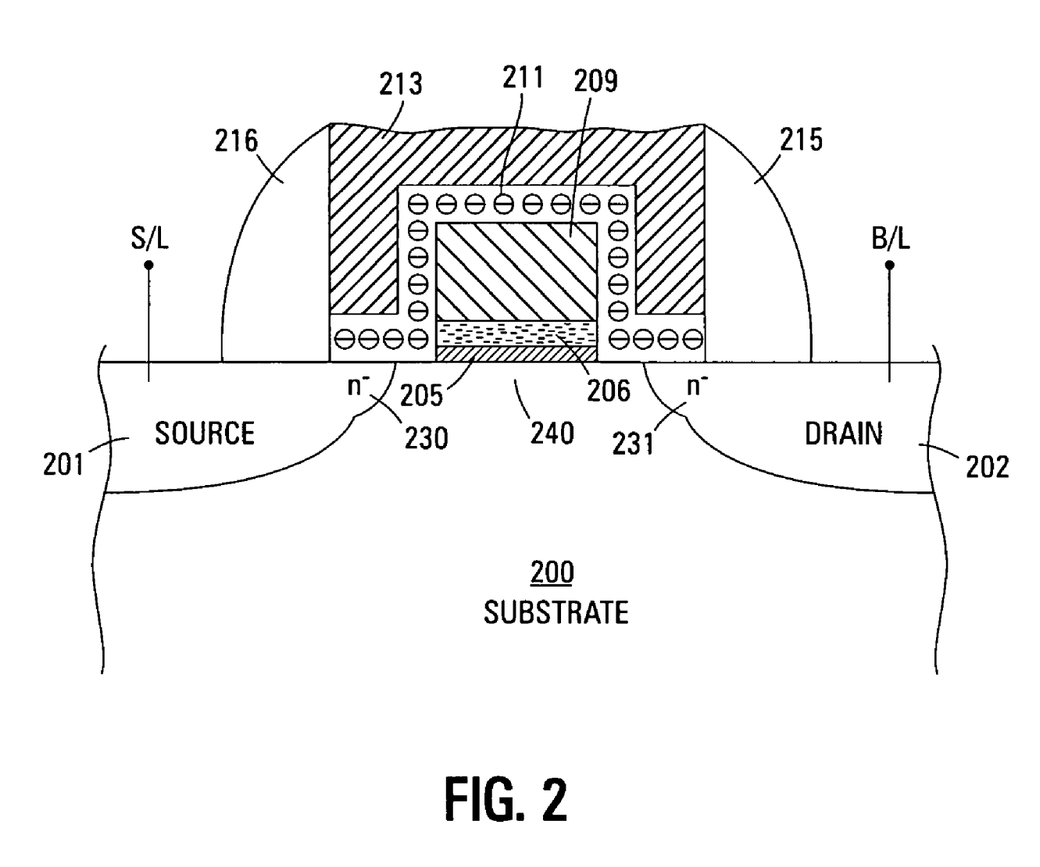
FIG. 2 shows a cross-sectional view of one embodiment of a planar non-volatile memory device of the present invention.

FIG. 2 illustrates a cross-sectional view of one embodiment of a planar, modified embedded DTM, non-volatile memory cell of the present invention. FIG. 3 illustrates a cross-section view of another embodiment of a planar, modified embedded DTM, non-volatile memory cell of the present invention. The difference in the two embodiments is the different trapping region that is discussed subsequently. For purposes of clarity, these figures show only one memory cell. It is well known in the art that a typical memory device may be comprised of millions or more of these cells.

The planar cells are fabricated on a substrate 200. In one embodiment, the substrate 200 is a p-type silicon. In an alternate embodiment, the substrate 200 is an n-type silicon.

Doped diffusion regions 201, 202 are created in the substrate 200 for the source and drain regions. If the substrate is a p-type material, the diffusion areas 201, 202 are n+ conductivity. However, an alternate embodiment could use an n-type substrate thus requiring heavily doped p-type diffusion regions 201, 202. The diffusion regions 201, 202 act as source lines 201 and bit lines 202, depending on the direction of operation of the memory string. While the left diffusion region 201 is shown as being the source line, if the cell is operated in the opposite direction, the right diffusion region 202 can operate as the source line while the left diffusion region 201 would be the bit line.

A channel region 240 is located in the substrate 200 between each source line and bit line diffusion area 201, 202. As is well known in the art, these are the regions 240 in which the channels form during operation of the memory cells.

A floating stack is formed over the substrate 200. The floating stack is comprised of a tunneling oxynitride layer 205, a trapping layer 206, and an injector layer 209.

The oxynitride layer 205, in one embodiment, is comprised of a scalable SiON layer 205 that provides charge transport by direct tunneling. This layer is approximately 1.5 nm thick with an atomic concentration of $Si:O:N \approx 1: \geq 1.3: \leq 0.5$, and a refractive index in the range of 1.5-1.6. While charge transport from the silicon substrate by direct tunneling is nearly equivalent to that of the same thickness of $SiO_2$, this layer provides an improvement in charge leakage as compared to $SiO_2$. In an alternate embodiment, this single layer may be replaced by multiple layers of direct tunnel dielectric of increasing band-offset and increasing higher dielectric constant (K). This would further improve the speed and charge retention of DTM.

The embedded trapping layer 206, in one embodiment, is a layer of embedded trap oxynitride or other appropriate insulator layer deeper energy high density (i.e., $>1 \times 10^{12}/cm^2$) traps. The trapping layer 306 in FIG. 3, on the other hand, is comprised of either embedded Si—Ge, Ge nano-dots, or embedded metal nano-dots in $SiO_2$ or other dielectric material. This provides longer charge retention in the deep quantum-well trap that is thus formed.

The oxynitride material might be SiON formed to a thickness in the range of 4.5-5.0 nm with a refractive index of approximately 1.8. The metal nano-dot elements can include Platinum (Pt), Iridium (Ir), Gold (Au), Cobalt (Co), Tungsten (W) or some other metal that provides deep energy electron and hole traps.

Figure 3:
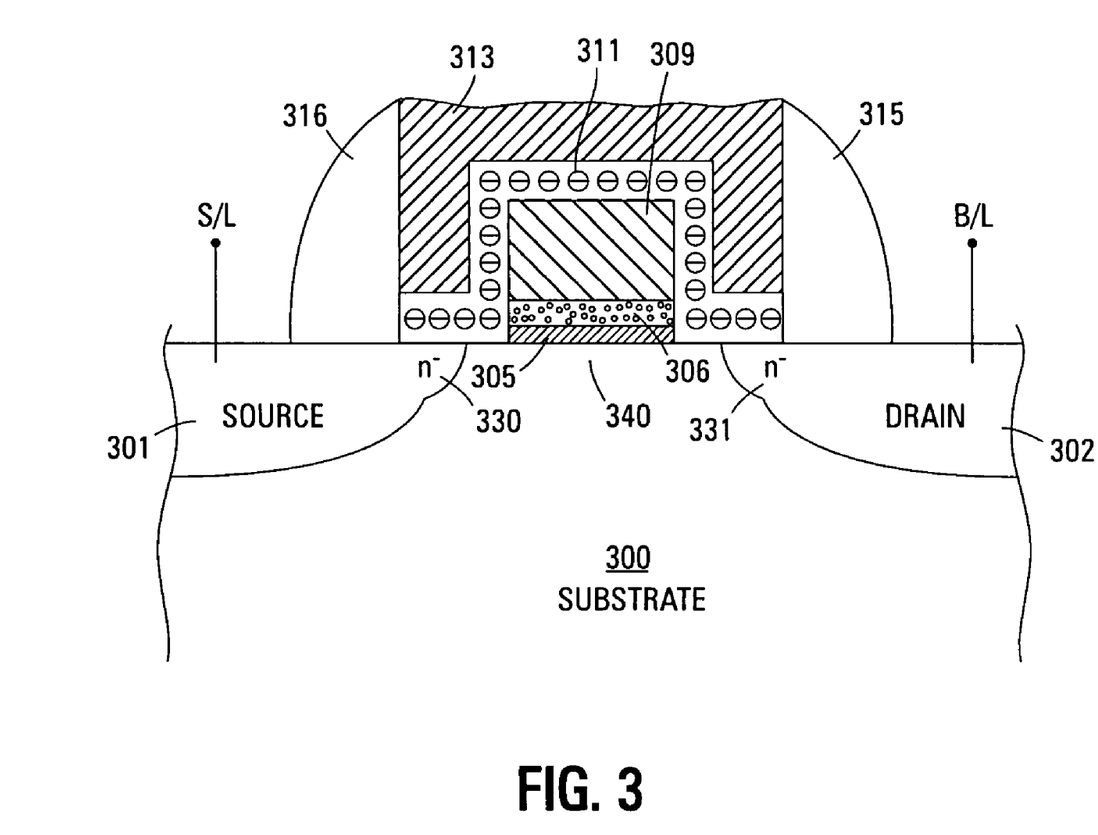
FIG. 3 shows a cross-sectional view of a second embodiment of a planar non-volatile memory device of the present invention.

In one embodiment, the metal nano-dot layer 306 of FIG. 3 is deposited by sputtering or evaporation at relatively low temperatures. The density range of the metal nano-dots in the trapping layer 306 can be in the range of $1 \times 10^{12}$ to $10 \times 10^{13}$ with typical dot sizes in the range of 1-5 nm and spaced greater than 3 nm apart in the high-K dielectric material. In another embodiment, Silicon-Germanium or Germanium nanocrystal embedded into $SiO_2$ or other higher K dielectric is deposited by LPCVD, ALD, or a sputtering technique. The density, size, and distribution would be similar to those of metal nano-dots. Alternate embodiments can use different densities, dot sizes, and spacing.

The injector layer 209 that is formed over the embedded trap layer 206 can be comprised of a silicon rich nitride (SRN) that is highly conductive. This layer 209 acts as a top floating electrode while chemically passivating the lower embedded trap layer 206. The injector SRN 209 provides a large vertical interface between the floating node and the control gate, thus further enhancing the voltage coupling between the two.

The injector SRN 209, in one embodiment, is formed to a thickness in the range of 10-15 nm and has a refractive index of 2.5-2.7. This layer 209 can be deposited by low temperature chemical vapor deposition (CVD) or atomic layer deposition (ALD). Alternate embodiments may use other thicknesses and/or methods of deposition.

The floating stack is separated from the wrapped, polysilicon control gate 213 by a high-K coupling medium of thin layers 211 of either oxide plus $Al_2O_3$ (K=10), oxide/ $HfO_2$ (K=24), oxide/$ZrO_2$ (K=24), oxide/$Pr_2O_3$ (K=30), or oxide/$TiO_2$ (K=60) The material next to silicon, $SiO_2$, or SRN causes a fixed negative charge in the layer 211 that helps to minimize electron leakage that would normally leak out from the trap layer 206 while providing enhanced coupling between the control gate 213 and the embedded floating trap layer 206. This layer 211 also provides enhanced voltage scalability over a typical DTM device due to its higher K value. Presence of a fixed, negative charge in this layer 211 effectively reduces the electron concentration of the n-regions of 230, 231 thereby reducing stand-by leakage of the device and improving charge retention.

The polysilicon control gate 213 is bordered on each side by sidewall spacers 215, 216. In one embodiment, the spacers 215, 216 are comprised of $SiO_2$. Alternate embodiments may use other materials.

The embodiments of the memory cells of the present invention are not limited to any one predetermined architecture. The cells can be used in NAND arrays, NOR arrays, AND arrays, direct tunnel memory for DRAM devices, virtual gate arrays (VGA), and other types of memory architectures.

The embodiment of FIG. 3 illustrates features that are substantially similar to the embodiment of FIG. 2 but with the embedded nanocrystal layer 306. In the interest of brevity, the reference numbers of FIG. 3 indicate substantially the same component as in FIG. 2 (i.e., 216=316), except for the embedded nanocrystal layer 306 in the embodiment of FIG. 3.

Figure 4:
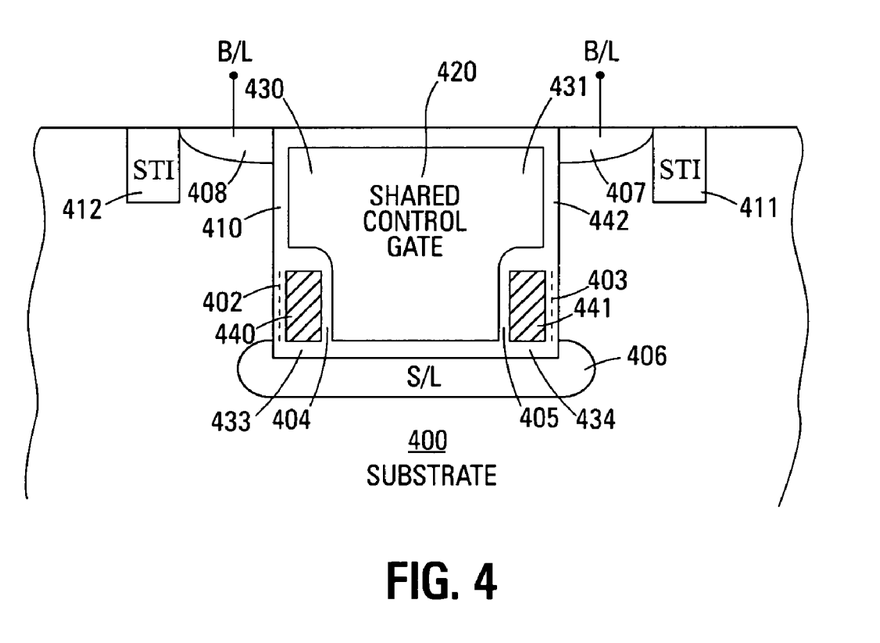
FIG. 4 shows a cross-sectional view of one embodiment of a three-dimensional, two-element, split channel non-volatile memory device of the present invention.

FIG. 4 illustrates a cross-sectional view of one embodiment of a three-dimensional, two-element, split channel DTM non-volatile memory device of the present invention. This embodiment uses substantially the same floating gate stack of the embodiment of FIG. 2 in a vertical, split channel, two-element configuration.

The vertical enhanced DTM cell is comprised of a trench formed in a silicon substrate 400. The trench contains two non-volatile cells, each comprised of a fixed threshold element 430, 431 in series with a bi-stable DTM element 433, 434, respectively. The fixed threshold elements 430, 431 provide over erasure protection and lower operating power requirements.

A shared control gate 420 is formed in the trench and separated from the trench sidewalls and the bi-stable elements by an oxide layer 410, 442. A shared source line 406 is formed in the substrate under the trench. Bit lines 407, 408 are formed in the substrate near the surface between the shallow trench isolation 411, 412 and the trench sidewalls.

Each bi-stable element 433, 434 is comprised of substantially the same DTM tunnel/trap layer 402, 403 as discussed with reference to FIGS. 2 and 3. In this embodiment, the high-K layer 404, 405 and the control gate 420 may or may not wrap around the bottom edge of the injector SRN layers 440, 441. The shared control gate 420 design provides two NOR non-volatile memory bits per trench without requiring any direct metal contact for the control gate 420 and the shared source line 406 within the cell. Such contacts are made outside the cell, thus enhancing array density. This provides a density potential of less than $3F^2$ for a NOR DTM cell.

The fixed threshold elements are not required for proper operation of the embodiment of FIG. 4. In an alternate embodiment, the bi-stable elements could be located on each sidewall and share the common control gate 420.

Figure 5:
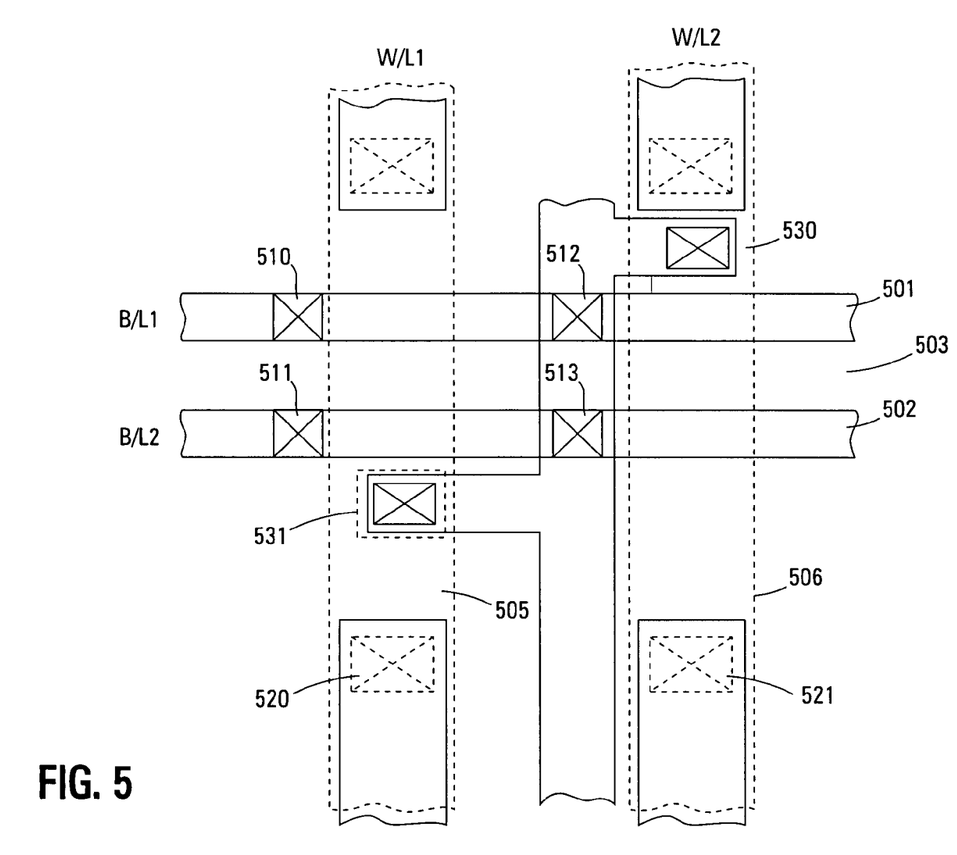
FIG. 5 shows a top layout view of a memory array in accordance with the embodiment of FIG. 4.

FIG. 5 illustrates a top layout view of the memory array in accordance with the embodiment of FIG. 4. This view shows two first metal (M1) level bit lines 501, 502 that are separated by an isolation region 503. The polysilicon word lines W/L1 and W/L2 505, 506 run substantially perpendicular to the bit lines 501, 502.

Shared source line contacts 530, 531 are formed outside the array and are connected by common M2 lines as shown. Self-aligned bit line contacts 510-513 are formed and connected to the M1 lines into the bit lines 501, 502. Polysilicon word lines are strapped outside the array block at 520, 521 by M2 lines as shown. The dense layout may yield nearly $3F^2$/bit memory density in the NOR implementation. A denser layout is feasible in a NAND implementation.

Figure 6:
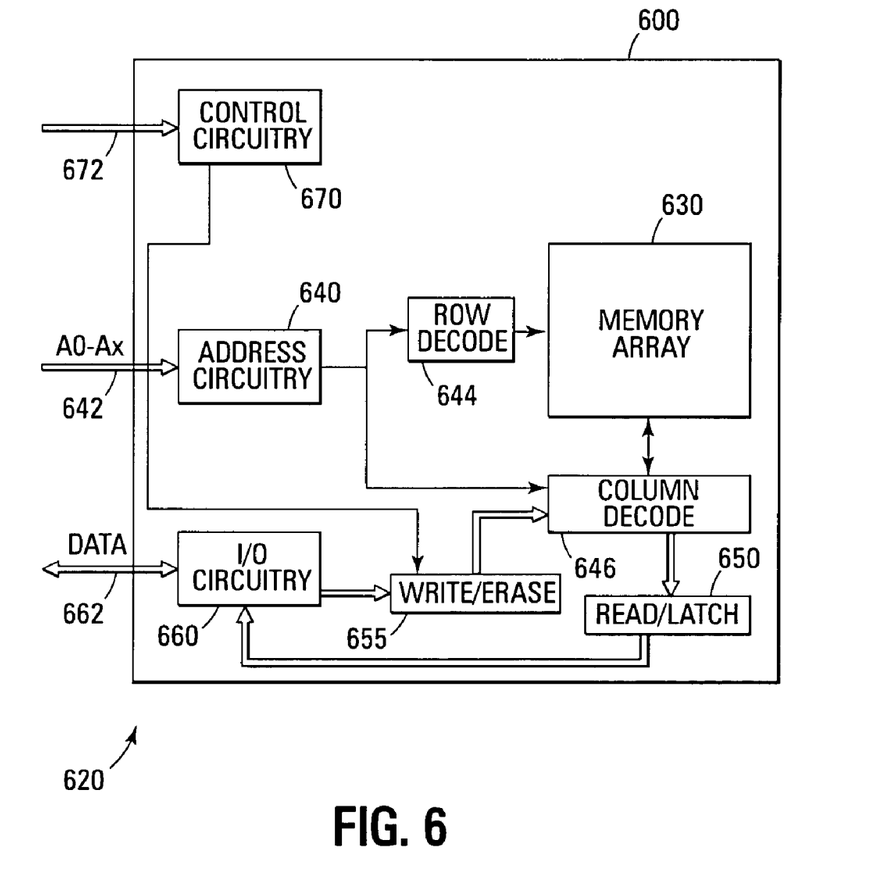
FIG. 6 shows a block diagram of one embodiment of a memory device of the present invention.

FIG. 6 illustrates a functional block diagram of a memory device 600 of the present invention. The memory device 600 has been simplified to focus on features of the memory that are helpful in understanding the present invention.

The memory device includes an array of memory cells 630 that can be comprised of the embodiments of the embedded trap DTM non-volatile memory cells that were previously illustrated. The memory array 630 is arranged in banks of rows and columns. The gates of each row of memory cells are coupled with a word line while the drain and source connections of the memory cells are coupled to bit lines.

An address buffer circuit 640 is provided to latch address signals provided on address input connections A0-Ax 642. Address signals are received and decoded by a row decoder 644 and a column decoder 646 to access the memory array 630. It will be appreciated by those skilled in the art, with the benefit of the present description, that the number of address input connections depends on the density and architecture of the memory array 630. That is, the number of addresses increases with both increased memory cell counts and increased bank and block counts.

The memory device 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over a plurality of data connections 662 with the controller 610. Write circuitry 655 is provided to write data to the memory array.

Control circuitry 670 decodes signals provided on control connections 672 from the processor 610. These signals are used to control the operations on the memory array 630, including data read, data write (program), and erase operations. The control circuitry 670 may be a state machine, a sequencer, or some other type of controller.

The memory device illustrated in FIG. 6 has been simplified to facilitate a basic understanding of the features of the memory. A more detailed understanding of internal circuitry and functions of memories are known to those skilled in the art.

CONCLUSION

The embodiments of the present invention provide a memory system that uses blocks of non-volatile memory with progressive levels of non-volatility. The memory blocks are comprised of scalable, modified "embedded trap DTM" non-volatile cells that can replace typical DRAM devices. Each different level of non-volatility uses a different thickness for the tunnel layer. The cells with the thicker tunnel layers have longer retention times but are slower during programming/erase operations. The cells with the thinner tunnel layers have shorter retention times but have substantially faster programming/erase operations and can thus replace typical DRAM devices.

Although specific embodiments have been illustrated and described herein, it will be appreciated by those of ordinary skill in the art that any arrangement that is calculated to achieve the same purpose may be substituted for the specific embodiments shown. Many adaptions of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory system comprising:
a control circuit for generating memory system signals; and
a plurality of memory arrays coupled to the control circuit, each memory array comprising a plurality of memory cells, each memory cell comprising a gate stack having a tunnel layer, at least two of the plurality of memory arrays comprising memory cells having tunnel layers with different thicknesses, each gate stack further comprising an embedded trap layer formed over the tunnel layer, and an injector layer formed separately from and coupled to the top of the trap layer,
wherein the injector layer is formed above and in contact with the trap layer; and wherein the embedded trap layer is ungraded; and a dielectric layer is formed between and in contact with the injector layer and a control gate.

2. The memory system of claim 1 wherein the dielectric layer has a high dielectric constant.

3. The memory system of claim 2 wherein the high dielectric constant layer is comprised of oxide and one of: $Al_2O_3$, $HfO_2$, $ZrO_2$, $Pr_2O_3$, and $TiO_2$.

4. The memory system of claim 1 wherein the control circuit is a microprocessor.

5. The memory system of claim 1 and further including a memory management unit, coupled to the control circuit and the plurality of memory arrays, for managing access to the plurality of memory arrays in response to the memory system signals.

6. The memory system of claim 1 wherein the injector layer is a silicon rich nitride.

7. The memory system of claim 1 wherein the cell is formed vertically along a sidewall of a trench in the substrate.

8. The memory system of claim 6 and further including a fixed threshold element formed vertically along the sidewall.

9. The memory system of claim 1 wherein the embedded trap layer is comprised of SiON.

10. The memory system of claim 1 wherein a first tunnel layer of the tunnel layers is 1.5 nm thick and a second tunnel layer of the tunnel layers is greater than 1.5 nm thick.

11. The memory system of claim 1 wherein the embedded trap layer is comprised of a metal nano-dot insulator layer.

12. The memory system of claim 11 wherein the metal nano-dot insulator layer is comprised of one of Platinum (Pt), Iridium (Ir), Gold (Au), Cobalt (Go), and Tungsten (W).

13. A memory device comprising:
a processor for generating memory signals;
a first memory array coupled to the processor, the first memory array comprised of a first plurality of memory cells having a tunnel oxynitride with a first thickness;
a second memory ray coupled to the processor, the second memory array comprised of a second plurality of memory cells having a tunnel oxynitride with a second thickness; and
a third memory array coupled to the processor, the third memory array comprised of a third plurality of memory cells having a tunnel oxynitride with a third thickness;
wherein the third thickness is greater than both the first and second thicknesses and the first thickness is less than the second thickness;
wherein each of the first, second, and third plurality of memory cells is further comprised of an oxynitride embedded trap layer formed over the tunnel oxynitride and a silicon rich nitride injector layer formed separately from and coupled to the top of each of the trap layers, wherein the injector layer is formed above and in contact with the trap layer; and wherein the oxynitride embedded trap layer is ungraded; and a dielectric layer is formed between and in contact with the injector layer and a control gate.

14. The memory device of claim 13 wherein the dielectric layer has a high dielectric constant and is formed over and substantially surrounds the injector silicon rich nitride layer.

15. The memory device of claim 13 wherein the first thickness is 1.5 nm, the second thickness is 2.5 nm, and the third thickness is 3.5 nm.

16. The memory device of claim 13 wherein the tunnel oxynitride has a refractive index of 1.55 and the oxynitride embedded trap layer has a refractive index of 1.8.

17. A memory system comprising:
a processor that generates control signals for the memory system;
a digital signal processor coupled to the processor for processing input signals for storage; and
a plurality of memory arrays coupled to the processor and the digital signal processor, each memory array comprising a plurality of memory cells, each memory cell comprising an oxynitride tunnel layer, an embedded trap layer formed over the oxynitride tunnel layer, and an injector layer formed separately from and coupled to the top of the trap layer, the injector layer being formed above and in contact with the trap layer, at least two of the plurality of memory arrays comprising memory cells having oxynitride tunnel layers with different thicknesses, wherein the embedded trap layer is ungraded and a dielectric layer is formed between and in contact with the injector layer and a control gate; and
a memory management unit coupled to the processor, the digital signal processor, and the plurality of memory arrays, the memory management unit controlling access to the plurality of memory arrays by the processor and the digital signal processor.

18. The system of claim 17 is integrated on a single integrated circuit.

19. The system of claim 17 wherein each of the plurality of memory arrays is one of a NAND array, a NOR array, an AND array, a virtual gate array.

20. The system of claim 17 wherein at least one of the plurality of memory arrays is a NOR array.

21. A non-volatile memory system comprising:
a plurality of non-volatile memory arrays wherein each non-volatile memory array is comprised of memory cells having a different charge retention time from the remaining non-volatile memory arrays in response to a thickness of an oxynitride tunnel layer, each memory cell comprising an oxynitride embedded trap layer formed on top of the tunnel layer and a silicon rich nitride injector layer formed separately from and coupled to the top of the trap layer, wherein the injector layer is formed above and in contact with the trap layer;

wherein the oxynitride embedded trap layer is ungraded; and a dielectric layer is formed between and in contact with the injector layer and a control gate.

22. The system of claim 21 wherein the memory cells are embedded trap direct tunnel memory cells.

23. A non-volatile memory system comprising:

a plurality of non-volatile memory arrays wherein each non-volatile memory array is comprised of memory veils having a different access speed from the remaining non-volatile memory arrays in response to a thickness of an oxynitride tunnel layer, each memory cell comprising an oxynitride embedded trap layer formed on top of the tunnel layer and a silicon rich nitride injector layer formed separately from and coupled to the top of the trap layer, wherein the injector layer is formed above and in contact with the trap layer;

wherein the embedded trap layer is ungraded and a dielectric layer is formed between and in contact with the injector layer and a control gate.

24. The system of claim 23 wherein the access times are in a range of 30-50 ns.

* * * * *

UNITED STATES PATENT AND TRADEMARK OFFICE
CERTIFICATE OF CORRECTION

PATENT NO.        : 7,276,760 B2
APPLICATION NO. : 11/066905
DATED             : October 2, 2007
INVENTOR(S)       : Bhattacharyya Page 1 of 1

It is certified that error appears in the above-identified patent and that said Letters Patent is hereby corrected as shown below:

In column 9, line 53, in Claim 8, delete "claim 6" and insert -- claim 7 --, therefor.

In column 9, line 64, in Claim 12, delete "(Go)," and insert -- (Co), --, therefor.

In column 10, line 4, in Claim 13, delete "ray" and insert -- array --, therefor.

In column 10, line 32, in Claim 16, after "1.8" insert -- . --.

In column 10, line 60, in Claim 19, after "array," insert -- and --.

In column 11, line 15, in Claim 23, delete "veils" and insert -- cells --, therefor.

Signed and Sealed this

Eleventh Day of December, 2007

JON W. DUDAS
*Director of the United States Patent and Trademark Office*